United States Patent
Tang et al.

(10) Patent No.: US 10,677,955 B2
(45) Date of Patent: Jun. 9, 2020

(54) TWO PART MAGNETIC FIELD GRADIENT SENSOR CALIBRATION

(71) Applicant: Halliburton Energy Services, Inc., Houston, TX (US)

(72) Inventors: Yumei Tang, Tomball, TX (US); Hsu-Hsiang Wu, Sugar Land, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 32 days.

(21) Appl. No.: 15/753,881

(22) PCT Filed: Oct. 12, 2015

(86) PCT No.: PCT/US2015/055122
§ 371 (c)(1),
(2) Date: Feb. 20, 2018

(87) PCT Pub. No.: WO2017/065731
PCT Pub. Date: Apr. 20, 2017

(65) Prior Publication Data
US 2018/0252838 A1    Sep. 6, 2018

(51) Int. Cl.
G01V 3/26       (2006.01)
E21B 47/022     (2012.01)
G01R 33/00      (2006.01)

(52) U.S. Cl.
CPC .......... *G01V 3/26* (2013.01); *E21B 47/02216* (2013.01); *G01R 33/0017* (2013.01); *G01R 33/0035* (2013.01)

(58) Field of Classification Search
None
See application file for complete search history.

(56) References Cited

U.S. PATENT DOCUMENTS

| 7,252,144 B2 | 8/2007 | Estes et al. |
| 2003/0056381 A1 | 3/2003 | Brosnahan et al. |
| 2004/0149004 A1 | 8/2004 | Wu |

(Continued)

FOREIGN PATENT DOCUMENTS

| EP | 1967689 A2 | 9/2008 |
| WO | 2014089490 A1 | 6/2014 |

OTHER PUBLICATIONS

European Application Serial No. 15906342.9; Extended European Search Report; dated Jul. 30, 2018, 9 pages.

(Continued)

*Primary Examiner* — Douglas X Rodriguez
(74) *Attorney, Agent, or Firm* — Gilliam IP PLLC

(57) ABSTRACT

An example method includes measuring, with a sensor tool, an electromagnetic field generated by an excitation source in order to determine an azimuth angle from the sensor tool to the source. An initial calibration of the sensor tool is performed to generate a library of sensor tool constant coefficients. Each sensor tool coefficient in the library is associated with a different range of azimuth angles. A sensor tool constant coefficient is selected from the library of sensor tool constant coefficients in response to the azimuth angle from the sensor tool to the source. The gradient field component of down hole measurements provided by the sensor tool are then calibrated based on the selected sensor tool constant coefficient.

20 Claims, 7 Drawing Sheets

(56) References Cited

U.S. PATENT DOCUMENTS

| | | |
|---|---|---|
| 2005/0211469 A1 | 9/2005 | Kuckes et al. |
| 2010/0155139 A1 | 6/2010 | Kuckes |
| 2011/0006773 A1* | 1/2011 | Bittar ................ E21B 47/02216 |
| | | 324/333 |
| 2011/0308794 A1 | 12/2011 | Bittar et al. |
| 2012/0125077 A1* | 5/2012 | Rodney ................ E21B 47/022 |
| | | 73/1.37 |
| 2014/0191761 A1* | 7/2014 | San Martin ........... E21B 47/011 |
| | | 324/339 |

OTHER PUBLICATIONS

International Application Serial No. PCT/US2015/055122, International Search Report dated Jul. 22, 2016, 3 pgs.
International Application Serial No. PCT/US2015/055122, Written Opinion dated Jul. 22, 2016, 9 pgs.
CA Application Serial No. 2,995,946, First Examiner's Letter, dated Dec. 4, 2018, 3 pages.

* cited by examiner

TWO PART MAGNETIC FIELD GRADIENT SENSOR CALIBRATION

BACKGROUND

Magnetic ranging refers to well positioning that provides relative direction and distance of one well with respect to another. Several technologies for ranging from a ranging well to a remote casing in a target well are based upon launching an alternating current at a known frequency from a power supply at the earth's surface down the casing of the target well in order to generate a magnetic field radiated from the target well casing. A sensor in the ranging well may detect the magnetic field and, thus, be able to determine a distance and direction to the target well. Sensor measurement error may reduce the accuracy of the ranging operation.

DETAILED DESCRIPTION

Some of the challenges noted above, as well as others, may be addressed by implementing the apparatus, systems, and methods described herein. In many examples, a sensor tool may be calibrated as disclosed herein to provide improved accuracy in ranging operations. The examples described herein operate to provide information that assists in determining relative distance and direction from one well to another. For example, determining the location of a target well (e.g., existing well) in relation to a ranging well (e.g., drilling well). The examples described herein determine, on the surface, a sensor tool constant coefficient (tool calibration coefficient) at different ranges of azimuth angles relative to an excitation source on the basis of laboratory data. The sensor tool measurements are then calibrated down hole by selecting the tool constant coefficient corresponding to the azimuth angle relative to the target well downhole.

A "target well" may be defined herein as a well, the location of which is to be used as a reference for the construction of another well. The other well may be defined as a "ranging well." Other embodiments may reverse this terminology since the embodiments are not limited to any one well being the target well and any one well being the ranging well. The ranging well may be used in steam assisted gravity drainage (SAGD), well intersection, relief well intersection, well avoidance, or any other usage where ranging, maintaining, avoiding, or intersecting between two wells is desirable.

Figure 1:
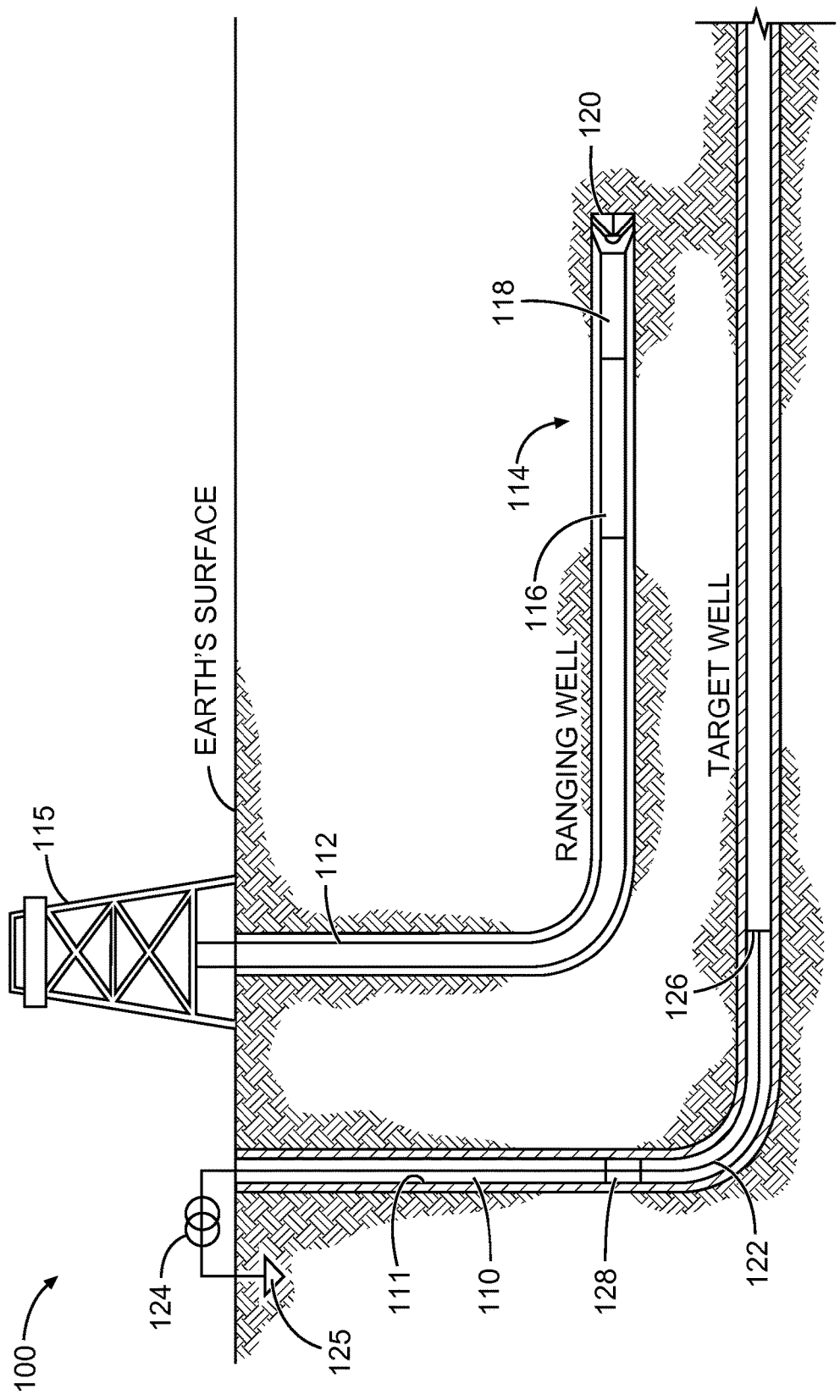
FIG. 1 is a diagram of an example ranging system, according to aspects of the present disclosure.

FIG. 1 is a diagram of an example ranging system, according to aspects of the present disclosure. In this example, a target wellbore 110 is drilled using any suitable drilling technique. The target wellbore 110 may then be cased with a casing string 111.

A wellbore 112 (i.e., ranging well, drilling well) may then be drilled using a bottom hole assembly (BHA) 114 that extends from a derrick 115. The BHA 114 may be, for example, a logging-while drilling ("LWD") assembly, a measurement while drilling assembly ("MWD") or other desired drilling assembly. The BHA 114 may include a drilling motor 118 and a drill bit 120. A drilling system is shown and described subsequently in greater detail with reference to FIG. 5.

Although the ranging wellbore 112 is described as being subsequently drilled, other examples may drill the target wellbore 110 and ranging wellbore 112 substantially simultaneously. Moreover, in yet another example, the BHA 114 may be embodied as a wireline application (without a drilling assembly) in order to perform logging operations, as shown and described subsequently with reference to FIG. 6.

In the illustrated example, the BHA/drilling assembly 114 includes a sensor tool 116 having one or more electromagnetic field sensors and circuitry for data communication to and from the surface. The sensor tool 116 is shown and described subsequently in greater detail with reference to FIG. 2.

In an example ranging method, a source launches a signal (e.g., alternating current (AC) or direct current (DC) of approximately 0-30 Hertz and approximately 5-30 Amperes) down the casing 111 of the target wellbore 110. This may be accomplished by a connection 126 of an electric current supply 124 (e.g., DC or AC power supply) to the target wellbore casing 111. The casing 111 may then be considered the excitation source as used subsequently. In another example, the source may be located downhole.

Measurements may be taken by the calibrated sensor tool 116, as well as other tools, at various depth intervals in the ranging wellbore 112. These measurements may include the magnitude, the direction and the radial gradient of the electromagnetic field produced by the current flow on the target wellbore 110. Other measurements may include the magnitude and the direction of the Earth's magnetic field and the direction of gravity in the wellbore being drilled in order to determine the roll angle and inclination of the ranging wellbore 112. As disclosed herein, data from these measurements may be used in determining a relative distance and direction of the ranging wellbore 112 from the target wellbore 110. Calibration of electromagnetic field measurements performed by the sensor tool 116 is discussed subsequently.

Figure 2:
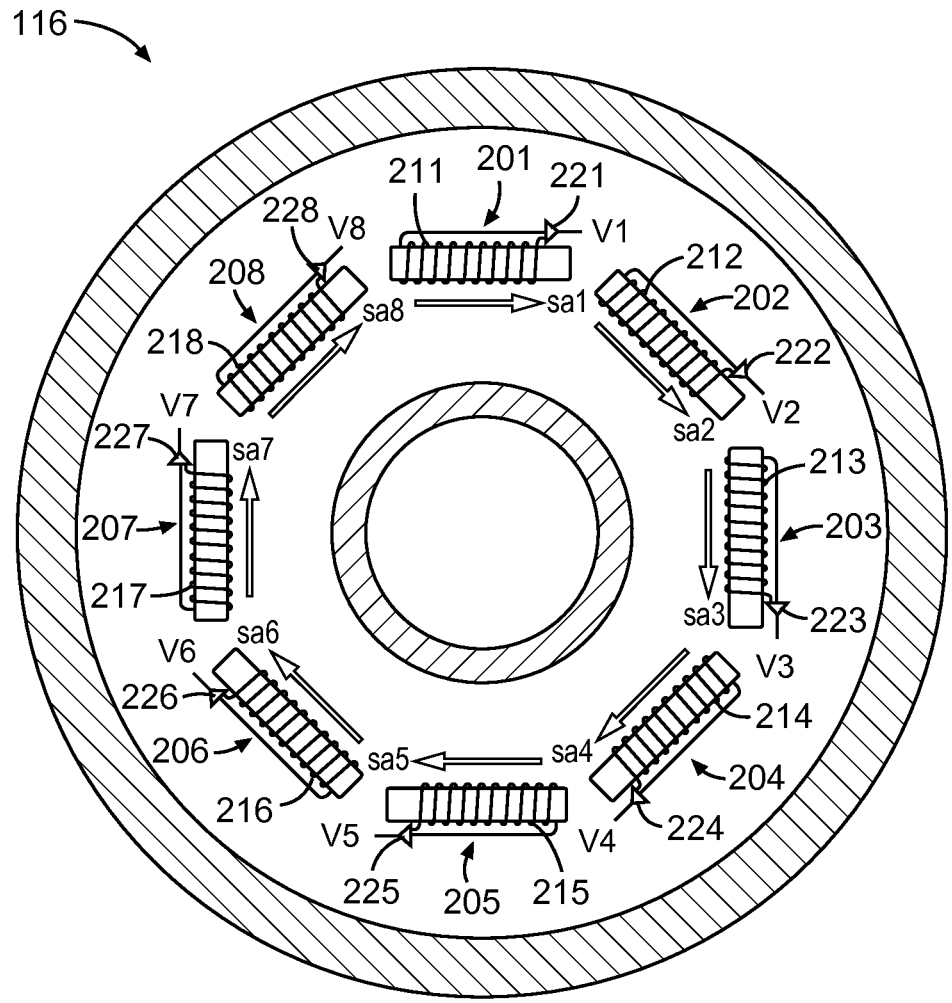
FIG. 2 is a diagram of an example sensor tool apparatus for use in the ranging well, according to aspects of the present disclosure.

FIG. 2 is a diagram of an example sensor tool apparatus for use in the ranging well, according to aspects of the present disclosure. The sensor tool 116 is an electromagnetic field sensing instrument or magnetic gradiometer and includes properties for making measurements of the radial electromagnetic field gradient.

The tool 116 includes a plurality of electromagnetic field sensors 201-208, separated from each other, with axes of sensitivity substantially perpendicular to the longitudinal axis of the tool 116. The tool 116 is shown including eight primary electromagnetic field sensors 201-208 (i.e., induction coil sensors, fluxgate magnetometers) substantially equally spaced around the periphery of the tool 116. Other examples may use different quantities of induction coil sensors 201-208. Each of these sensors 201-208 measures a vector component of the magnetic field in the direction of the arrows SA1-SA8. The sensors 201-208, or at least pairs of sensors, may be substantially identical.

Each sensor 201-208 includes a respective induction coil 211-218. The axes of the coils 211-218 are orientated perpendicular to a drilling axis 220 (i.e., longitudinally along the wellbore) and located radially from the axis of the drilling tool, as far as mechanically possible, and as allowed by the BHA diameter. In an example, the sensors 201-208 are located every 45° with respect to each other around the drilling axis 220. Such a configuration may result in an improved response to the radial electromagnetic field gradient from the targeting wellbore source. In addition, the sensors 201-208 can be also implemented by fluxgate magnetometer to measure electromagnetic fields from the source down hole.

The induction coil sensors 201-208 respectively generate output demodulated DC voltages V1-V8 in response to a received magnetic field. In an eight sensor tool, the voltages may be expressed as follows:

$$|V1 V2 \ldots V8| =$$

$$|H * \cos\theta H * \sin\theta G * \cos 2\theta G * \sin 2\theta| * \begin{vmatrix} V1c1 & V2c1 & \ldots & V8c1 \\ V1s1 & V2s1 & \ldots & V8s1 \\ V1c2 & V2c2 & \ldots & V8c2 \\ V1s2 & V2s2 & \ldots & V8s2 \end{vmatrix}$$

where V1C1-V8$c$1 and V1$s$1-V8$s$1 are cosine and sine tool constant coefficients respectively, H represents a uniform electromagnetic field component (see FIG. 3), and G represents a gradient magnetic field component (see FIG. 3) at the center of the sensor tool in the plane. The angle θ is the relative azimuthal angle between the ranging wellbore and the target wellbore. This equation may be represented by Vm=Hcs*CalMat$_{fine}$ where Hcs represents the magnetic field component cosine/sine terms and CalMat$_{fine}$ represents the calibration matrix, using known sensor tool measurements azimuthal angles over a relatively small range (e.g., approximately ≤90°) that covers the azimuthal angle, as described subsequently.

If the elements of the calibration matrix CalMat$_{fine}$ are known, Hcs can be solved with the measurements by the matrix calculation. Thus, the distance, R, and relative angle, θ, of the ranging wellbore from the target wellbore may be calculated with the items in Hcs as follows:

$$\theta = \arctan(Hcs(2)/Hcs(1))$$

$$H = \sqrt{Hcs(1)^2 + Hcs(2)^2}$$

$$R = H/\sqrt{Hcs(3)^2 + Hcs(4)^2}$$

Each respective sensor coil 211-218 may also be coupled to respective circuitry that includes a low noise, high gain, amplifier 221-228 (e.g., low-pass, high-pass, band-pass). The amplifier voltages may be fed individually into a controller for analysis of the different field components (see FIG. 3). The voltages V1-V8 are proportional to the amplitude of the electromagnetic field projection on each sensor's respective axis at each sensor's location.

The sensor tool apparatus 116 may further include a system for control and calibration of the tool 116. For example, the system of FIG. 7 may be included within the tool housing or located elsewhere and coupled to the sensor tool through telemetry. As described subsequently with reference to FIG. 7, the system may perform the calibration methods disclosed herein.

Figure 3:
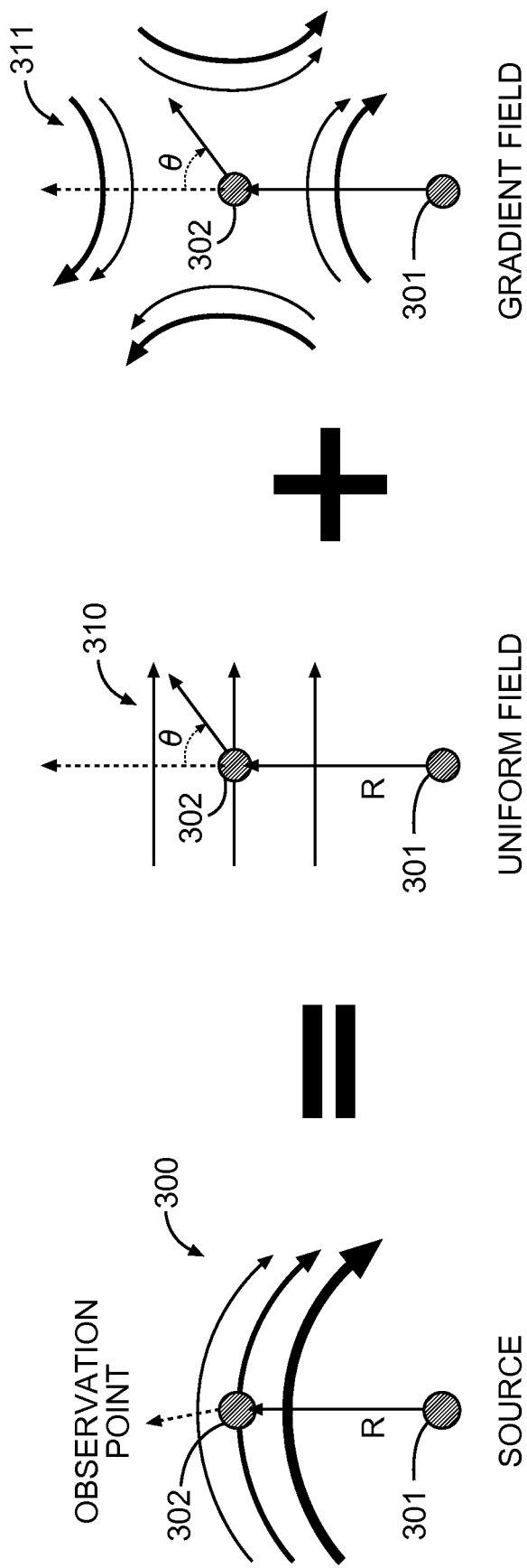
FIG. 3 is a diagram of magnetic field components as received by the sensor tool, according to aspects of the present disclosure.

FIG. 3 is a diagram of magnetic field components as received by the sensor tool, according to aspects of the present disclosure. The source 301 of the electromagnetic field (e.g., casing in target well) generates the total electromagnetic field 300 to which the sensor tool 302 is exposed. This field 300 circulates around the target wellbore in accordance with the well-known right-hand rule.

The total electromagnetic field 300 is a combination of a uniform electromagnetic field component 310 and a gradient (i.e., correction) electromagnetic field component 311. The uniform electromagnetic field component 310 may be expressed as I/2πR and the gradient electromagnetic field 311 may be expressed as I/2πR$^2$, where R represents the center-to-center radial distance from the target wellbore to the ranging wellbore and I represents the current, in Amperes, on the target wellbore casing.

Imperfections in sensor tool manufacture can affect the response voltages Vl-V8. Thus, the method disclosed herein provides a calibration of the sensor tool in order to improve the accuracy of the sensor tool measurements in a ranging operation. The method generates a calibration matrix, as described subsequently, using a known azimuthal angle of the sensor tool relative to the source and a relatively small range (e.g., approximately ≤90°) of azimuthal angles in the calibration matrix. Thus, instead of generating a single tool constant coefficient based on a range of 0°-360°, the method disclosed herein generates a plurality of tool constant coefficients (i.e., tool constant coefficient library) based on the relatively smaller azimuth angle ranges (e.g., approximately ≤90°). An azimuth angle range of approximately 90° is for purposes of illustration only as any angle range that is less than 360° will operate properly to implement most examples. Generally, the greater the quantity of azimuth angle ranges used, the more accurate the calibration of the sensor tool.

Figure 4:
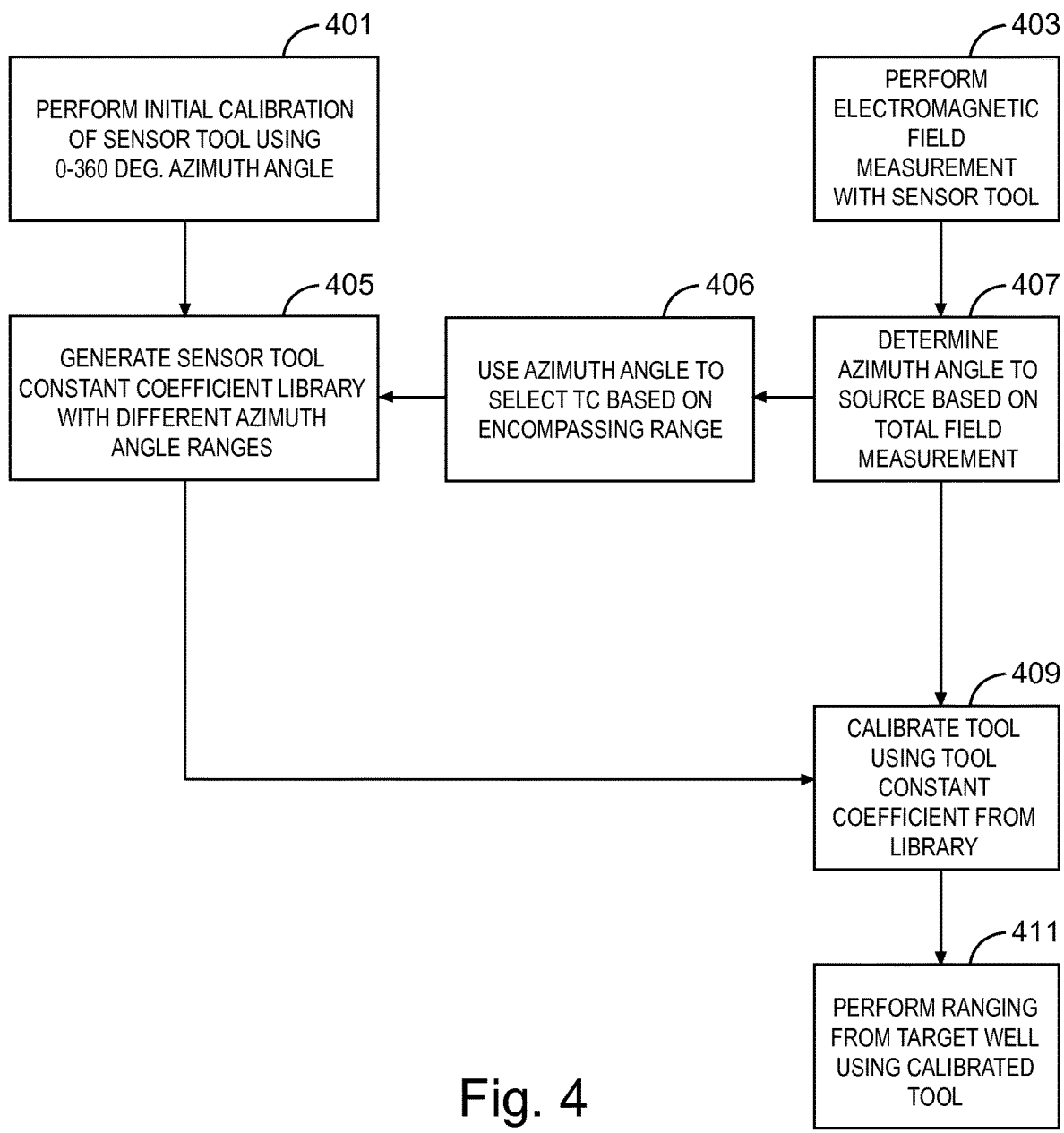
FIG. 4 is a flowchart of an example method for calibration of the sensor tool as used in a ranging operation, according to aspects of the present disclosure.

FIG. 4 is a flowchart of an example method for calibration of the sensor tool as used in a ranging operation, according to aspects of the present disclosure. This method assumes the orientation between the target wellbore and the ranging wellbore as illustrated in FIG. 3. Namely, the sensor tool 302 in the ranging wellbore has a distance of R from the source 301 in the target wellbore and a relative azimuth angle of θ from the source 301.

In block 401, the sensor tool is initially calibrated using an initial 0°-360° azimuth angle relative direction angle of the sensor tool from the source. The initial calibration may be calculated with the total calibration matrix shown above or with another determination method. Using the data generated in block 401, a plurality of sensor tool constant coefficients (e.g., library of sensor tool constant coefficients) may be generated in block 405. The data generated in block 401 may include a plurality of measurements of the magnetic field at each sensor of the sensor tool at different rotational positions of the sensor tool.

In block 405, a plurality of tool constant coefficients (i.e., tool constant coefficient library) are generated, each tool constant coefficient associated with a different range of azimuth angles. For example, a first tool constant coefficient might cover azimuth angles in a range of 0°-90°, a second tool constant coefficient might cover azimuth angles in a range of 91°-180°, a third tool constant coefficient might cover azimuth angles in a range of 181°-270°, and a fourth tool constant coefficient might cover azimuth angles in a range of 271°-360°. These angle ranges are for purposes of illustration only as other angle ranges and other quantities of angle ranges are possible.

In block 403, the sensor tool performs an electromagnetic field measurement of the electromagnetic field generated by the source. In block 407, the total electromagnetic field (i.e., uniform field component and gradient field component) is used to generate an azimuth angle to the source without any calibration. Determining this azimuth angle may be accomplished as described previously.

Using this azimuth angle, the sensor tool constant coefficient library is accessed, in block 406, to determine the tool constant coefficient associated with the particular azimuth angle range that encompasses the azimuth angle.

As an example of operation, if the azimuth angle from the sensor tool to the source is determined to be approximately 30°, this angle is used in accessing the sensor tool constant coefficient library to determine that the first tool constant coefficient, having a range of 0°-90°, encompasses the 30° azimuth angle. Thus, the first tool constant coefficient is used, in block 409, in performing the calibration (e.g., adjusting) of measurements from the sensor tool. This example is for purposes of illustration only as the quantity of different azimuth angle ranges may vary with different examples and, thus, the associated tool constant coefficient may be different.

In block 409, the sensor tool is calibrated using the tool constant coefficient retrieved from the tool constant coefficient library. This calibration calibrates the tool's response to the uniform field component and/or the gradient field component of the total electromagnetic field. The calibration may be performed using the following equations and includes adjusting the uniform and gradient field measurements by the sensor too in response to the selected tool constant coefficient. The matrices include measured voltages that are recorded at different known angles of rotation of the sensor tool:

$$\begin{vmatrix} V11 & V21 & ... & V81 \\ V12 & V22 & ... & V82 \\ & & ... & \\ & & ... & \\ V1n & V2n & ... & Vij \end{vmatrix} =$$

$$\begin{vmatrix} H*\cos(\theta_1) & H*\sin(\theta_1) & G*\cos(2\theta_1) & G*\sin(2\theta_1) \\ H*\cos(\theta_2) & H*\sin(\theta_2) & G*\cos(2\theta_2) & G*\sin(2\theta_2) \\ & & ... & \\ & & ... & \\ H*\cos(\theta_n) & H*\sin(\theta_n) & G*\cos(2\theta_n) & G*\sin(2\theta_n) \end{vmatrix} \times CalMat_{fine}$$

where Vij represents the voltage measured by the $i^{th}$ sensor of (V1-V8) at the $j^{th}$ rotation angle ($\theta_j$) and n is the total number of rotation angles.

Continuing the above example in which the tool comprises eight sensors and an azimuth angle of 30° was determined in block 407. This equation can be expressed as:

$$\begin{vmatrix} V11 & V21 & ... & V81 \\ V12 & V22 & ... & V82 \\ V13 & V23 & ... & V83 \\ V14 & V24 & ... & V84 \end{vmatrix} =$$

$$\begin{vmatrix} H*\cos(-30°) & H*\sin(-30°) & G*\cos(-60°) & G*\sin(-60°) \\ H*\cos(0°) & H*\sin(0°) & G*\cos(0°) & G*\sin(0°) \\ H*\cos(30°) & H*\sin(30°) & G*\cos(60°) & G*\sin(60°) \\ H*\cos(60°) & H*\sin(60°) & G*\cos(120°) & G*\sin(120°) \end{vmatrix} \times$$

$$CalMat_{fine}$$

Once the sensor tool is calibrated using the tool constant coefficient, a ranging operation may be performed in block 411 using the calibrated tool. The sensor tool, calibrated by one of a plurality of tool constants, may thus provide an azimuth angle and distance to the source in the target well.

Figure 5:
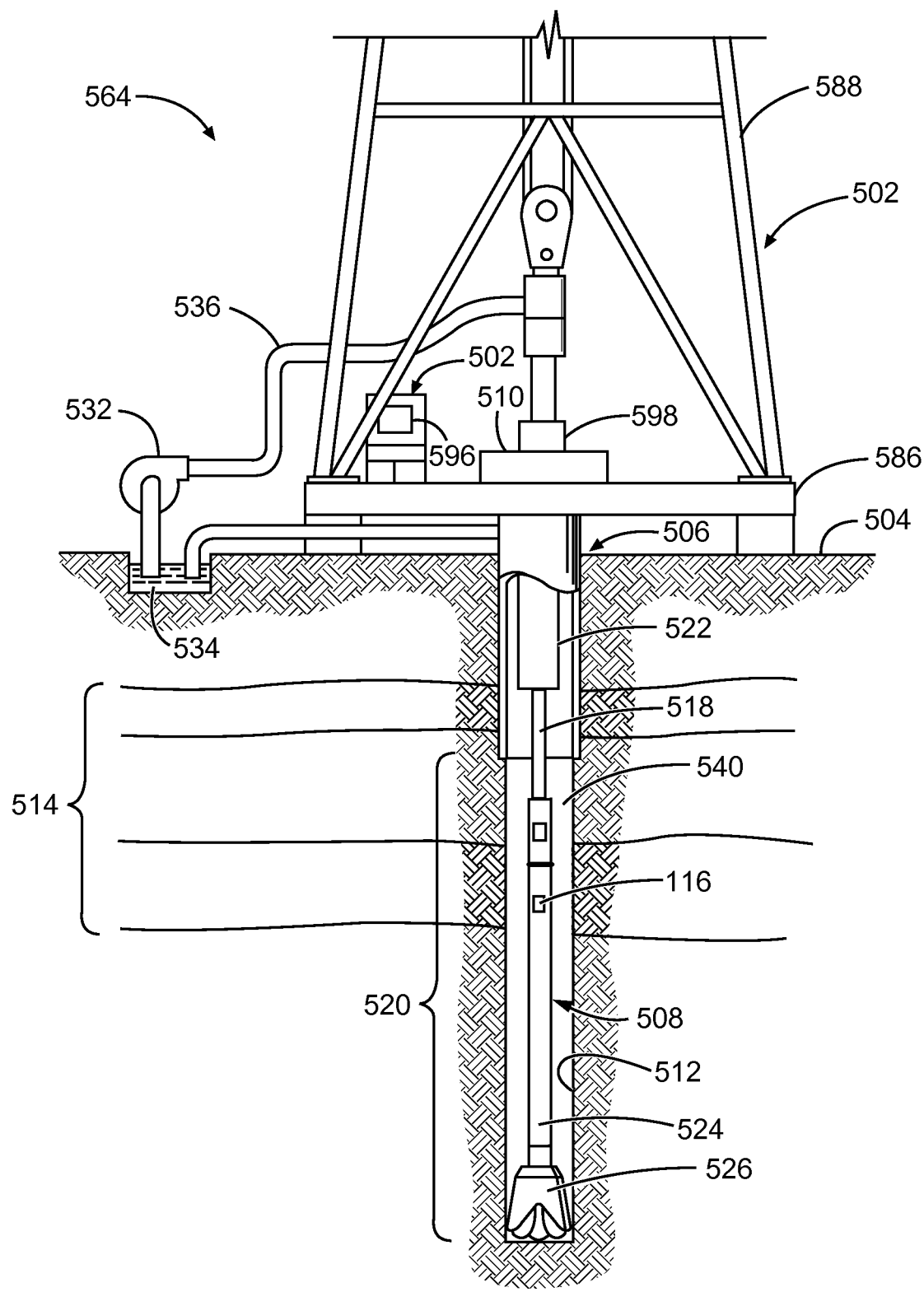
FIG. 5 is a diagram of an example drilling rig system, according to aspects of the present disclosure.

FIG. 5 is a diagram showing a drilling system 564, according to various examples of the disclosure. The system 564 includes a drilling rig 502 located at the surface 504 of a well 506. The drilling rig 502 may provide support for a drillstring 508. The drillstring 508 may operate to penetrate the rotary table 510 for drilling the borehole 512 through the subsurface formations 514. The borehole 512 may operate as either the ranging borehole or the target borehole, as illustrated in FIG. 1.

The drillstring 508 may include a drill pipe 518 and a bottom hole assembly (BHA) 520 (e.g., drill string), perhaps located at the lower portion of the drill pipe 518. The BHA 520 may include drill collars 522, a down hole tool 524 including the calibrated sensor tool 116, and a drill bit 526. The drill bit 526 may operate to create the borehole 512 by penetrating the surface 504 and the subsurface formations 514. The down hole tool 524 may comprise any of a number of different types of tools besides the sensor tool 116. The sensor tool 116, calibrated to the gradient field component as previously discussed, may be used in ranging operations for SAGD operations, well intersection, relief well intersection, well avoidance, or any other usage where ranging, maintaining, avoiding, or intersecting between two wells is desirable.

During drilling operations, the drillstring 508 (perhaps including the drill pipe 518 and the BHA 520) may be rotated by the rotary table 510. Although not shown, in addition to or alternatively, the BHA 520 may also be rotated by a motor (e.g., a mud motor) that is located down hole. The drill collars 522 may be used to add weight to the drill bit 526. The drill collars 522 may also operate to stiffen the bottom hole assembly 520, allowing the bottom hole assembly 520 to transfer the added weight to the drill bit 526, and in turn, to assist the drill bit 526 in penetrating the surface 504 and subsurface formations 514.

During drilling operations, a mud pump 532 may pump drilling fluid (sometimes known by those of ordinary skill in the art as "drilling mud") from a mud pit 534 through a hose 536 into the drill pipe 518 and down to the drill bit 526. The drilling fluid can flow out from the drill bit 526 and be returned to the surface 504 through an annular area 540 between the drill pipe 518 and the sides of the borehole 512. The drilling fluid may then be returned to the mud pit 534, where such fluid is filtered. In some examples, the drilling fluid can be used to cool the drill bit 526, as well as to provide lubrication for the drill bit 526 during drilling operations. Additionally, the drilling fluid may be used to remove subsurface formation cuttings created by operating the drill bit 526.

Figure 6:
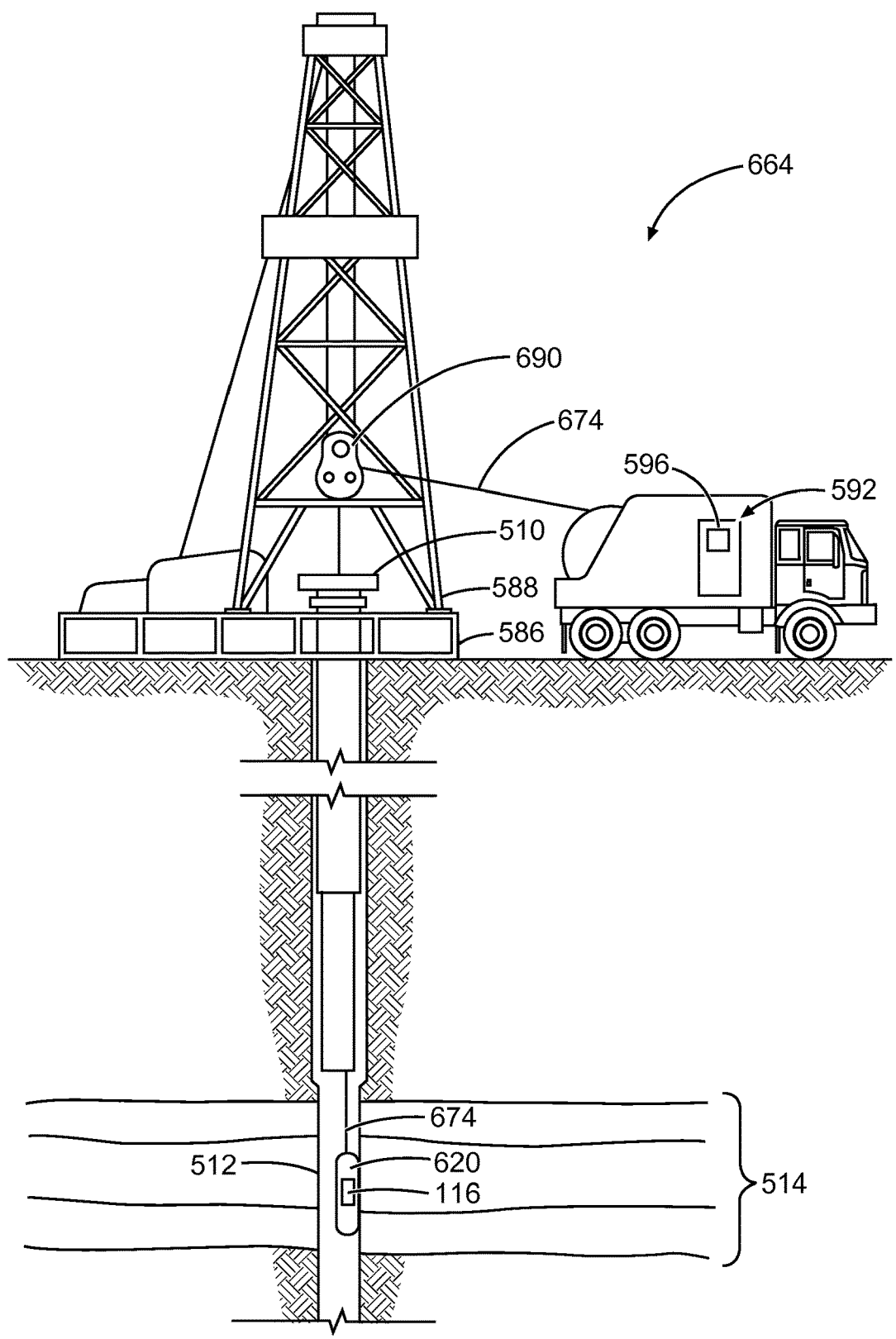
FIG. 6 is a diagram of an example wireline system, according to aspects of the present disclosure.
Figure 7:
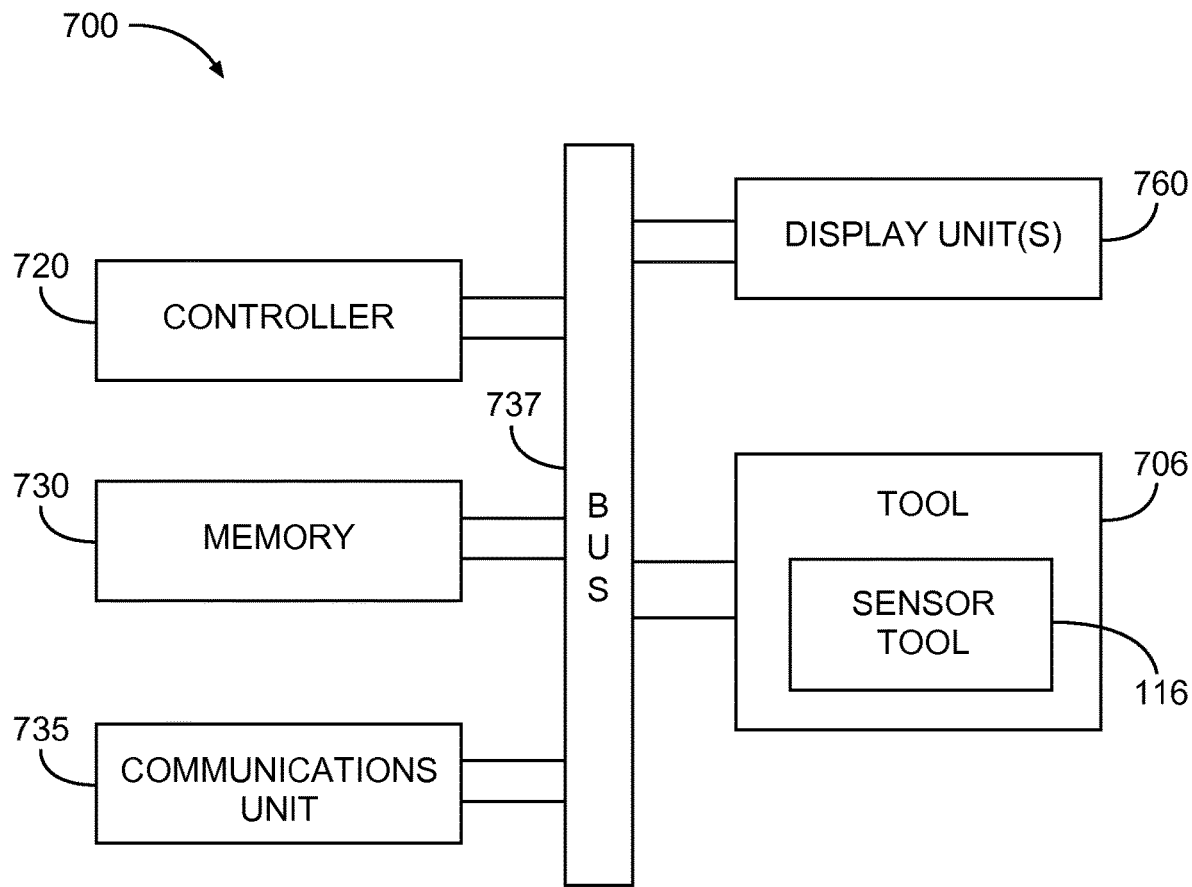
FIG. 7 is a block diagram of an example system operable to implement the activities of multiple methods, according to various examples of the disclosure.

As shown in FIG. 6, a workstation 592 including a controller 596 may include modules comprising hardware circuitry, a processor, and/or memory circuits that may store software program modules and objects, and/or firmware, and combinations thereof, such as illustrated in FIG. 7, that are configured to execute the method of FIG. 4. For example, the workstation 554 with controller 596 may be configured to receive the voltages as measured by the sensor tool at different rotation angles and generate the plurality of tool constant coefficients that encompass a particular range of azimuth angles.

These implementations can include a machine-readable storage device having machine-executable instructions, such as a computer-readable storage device having computer-executable instructions. Further, a computer-readable storage device may be a physical device that stores data represented by a physical structure within the device. Such a physical device is a non-transitory device. Examples of machine-readable storage devices can include, but are not limited to, read only memory (ROM), random access memory (RAM), a magnetic disk storage device, an optical storage device, a flash memory, and other electronic, magnetic, and/or optical memory devices.

FIG. 6 is a diagram showing a wireline system 664, according to various examples of the disclosure. The system 664 may comprise a wireline logging tool body 620, as part of a wireline logging operation, that includes the calibrated sensor tool 116 as described previously. This wellbore may operate as either a ranging well or a target well, as illustrated in FIG. 1.

A drilling platform 586 equipped with a derrick 588 that supports a hoist 690 can be seen. Drilling oil and gas wells is commonly carried out using a string of drill pipes connected together so as to form a drillstring that is lowered through a rotary table 510 into a wellbore or borehole 512 as discussed previously with reference to FIG. 5. Here it is assumed that the drillstring has been temporarily removed from the borehole 512 to allow the wireline logging tool body 620, such as a probe or sonde with the sensor tool 116, to be lowered by wireline or logging cable 674 (e.g., slickline cable) into the borehole 512. Typically, the wireline logging tool body 620 is lowered to the bottom of the region of interest and subsequently pulled upward at a substantially constant speed.

During the upward trip, at a series of depths, wireline data may be collected from the calibrated sensor tool 116 in order determine a distance and angle relative to another well. The wireline data may be communicated to a surface logging facility (e.g., workstation 592) for processing, analysis, and/or storage. The logging facility 592 may be provided with electronic equipment for various types of signal processing as described previously. The workstation 592 may have a controller 596 that is coupled to the sensor tool 116 through the wireline 674 or telemetry in order to receive data from the sensor tool.

In both the drilling system and wireline system examples, the source may be located on the surface and launch the signal to produce the electromagnetic field down the casing. The source may also be located downhole and the electromagnetic field produced downhole.

FIG. 7 is a block diagram of an example system 700 operable to implement the activities of multiple methods, according to various examples of the disclosure. The system 700 may include a tool housing 706 having the sensor tool 116 such as that illustrated in FIG. 2. The system 700 of FIG. 7 may be implemented as shown in FIGS. 5 and 6 with reference to the workstation 592 and controller 596.

The system 700 may include circuitry such as a controller 720, a memory 730, and a communications unit 735. The memory 730 may be structured to include a database of sensor tool constant coefficients as described previously. The controller 720, the memory 730, and the communications unit 735 may be arranged to operate as a processing unit to control operation of the calibrated sensor tool 116 and execute any methods disclosed herein.

The communications unit 735 may include down hole communications for appropriately located sensors in a wellbore. Such down hole communications can include a telemetry system. The communications unit 735 may use combinations of wired communication technologies and wireless technologies at frequencies that do not interfere with ongoing measurements.

The system 700 may also include a bus 737, where the bus 737 provides electrical conductivity among the components of the system 700. The bus 737 can include an address bus, a data bus, and a control bus, each independently configured or in an integrated format. The bus 737 may be realized using a number of different communication mediums that allows for the distribution of components of the system 700. The bus 737 may include a network. Use of the bus 737 may be regulated by the controller 720.

The system 700 may include display unit(s) 760 as a distributed component on the surface of a wellbore, which may be used with instructions stored in the memory 730 to implement a user interface to monitor the operation of the tool 706 or components distributed within the system 700. Such a user interface may be operated in conjunction with the communications unit 735 and the bus 737. Many examples may thus be realized. A few examples of such examples will now be described.

Example 1 is a method comprising: measuring, with a sensor tool, an electromagnetic field generated by a source to determine an azimuth angle from the sensor tool to the source; performing an initial calibration of the sensor tool to generate a plurality of sensor tool constant coefficients, each sensor tool coefficient associated with a different range of azimuth angles; selecting a sensor tool constant coefficient from the plurality of sensor tool constant coefficients based on the azimuth angle from the sensor tool to the source; and calibrating the sensor tool based on the selected sensor tool constant coefficient.

In Example 2, the subject matter of Example 1 can further include wherein selecting the sensor tool constant coefficient comprises selecting the sensor tool constant coefficient associated with the range of azimuth angles that encompasses the azimuth angle from the sensor tool to the source.

In Example 3, the subject matter of Examples 1-2 can further include performing a ranging operation from a target well using the calibrated sensor tool.

In Example 4, the subject matter of Examples 1-3 can further include wherein performing the ranging operation comprises determining the azimuth angle and a distance to the source.

In Example 5, the subject matter of Examples 1-4 can further include wherein performing the initial calibration of the sensor tool comprises generating a plurality of measurements of a magnetic field at each sensor of the sensor tool, at different rotational positions of the sensor tool.

In Example 6, the subject matter of Examples 1-5 can further include wherein measuring, with the sensor tool, the electromagnetic field comprises measuring a uniform field component and a gradient field component of the electromagnetic field.

In Example 7, the subject matter of Examples 1-6 can further include wherein calibrating the sensor tool comprises calibrating a response of the sensor tool to the uniform field component and the gradient field component.

In Example 8, the subject matter of Examples 1-7 can further include wherein calibrating the response of the sensor tool comprises adjusting uniform field and gradient field measurements by the sensor tool in response to the selected sensor tool constant coefficient.

In Example 9, the subject matter of Examples 1-8 can further include wherein performing the initial calibration of the sensor tool comprises calibrating the sensor tool using a 0°-360° azimuth angle relative direction.

Example 10 is an apparatus comprising: a plurality of electromagnetic field sensors disposed around a periphery of the apparatus; and circuitry coupled to the plurality of electromagnetic field sensors to calibrate uniform field and gradient field measurements provided by the electromagnetic field sensors based on a selected one of a plurality of sensor tool constant coefficients, wherein each of the plurality of sensor tool constant coefficients is associated with a different range of azimuth angles of the apparatus from an excitation source.

In Example 11, the subject matter of Example 10 can further include wherein the plurality of electromagnetic field sensors comprise induction coil sensors.

In Example 12 the subject matter of Examples 10-11 can further include wherein the plurality of electromagnetic field sensors comprise fluxgate magnetometers.

In Example 13, the subject matter of Examples 10-12 can further include wherein the circuitry comprises memory to store a database of the plurality of sensor tool constant coefficients and their associated, respective range of azimuth angles.

In Example 14, the subject matter of Examples 10-13 can further include wherein the circuitry is to determine the selected one of the plurality of sensor tool constant coefficients in response to an azimuth angle between the apparatus and the excitation source.

Example 15 is a system comprising: a target well comprising a casing; an excitation source to produce an electromagnetic field; a sensor tool in a ranging well, the sensor tool to measure a total electromagnetic field including a uniform field component and a gradient field component; and circuitry coupled to the sensor tool to calibrate the uniform field and gradient field measurements from the sensor tool based on a selected one of a plurality of sensor tool constant coefficients, wherein each of the plurality of sensor tool constant coefficients is associated with a different range of azimuth angles of the sensor tool from the target well.

In Example 16, the subject matter of Example 15 can further include wherein the system further comprises a drill string and the sensor tool is disposed in the drill string.

In Example 17, the subject matter of Examples 15-16 can further include wherein the system further comprises a wireline tool and the sensor tool is disposed in the wireline tool.

In Example 18, the subject matter of Examples 15-17 can further include wherein the sensor tool comprises a plurality of sensors, each sensor having a sensor coil coupled to an amplifier.

In Example 19, the subject matter of Examples 15-18 can further include wherein each sensor is to generate a voltage that is proportional to an amplitude of the electromagnetic field projection on its respective axis.

In Example 20, the subject matter of Examples 15-19 can further include wherein the circuitry is further to select the tool constant coefficient based on an azimuth angle between the sensor tool and the target well.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

What is claimed is:

1. A method comprising:
measuring, with a sensor tool, an electromagnetic field generated by a source using a first range of azimuth angles;
performing a first calibration of the sensor tool to generate a plurality of sensor tool constant coefficients, each sensor tool constant coefficient associated with a different subrange within the first range of azimuth angles;
determining an azimuth angle from the sensor tool to the source from the electromagnetic field measurements and the plurality of sensor tool constant coefficients;
selecting a sensor tool constant coefficient from the plurality of sensor tool constant coefficients based on the determined azimuth angle from the sensor tool to the source; and
performing a second calibration of the sensor tool based on the selected sensor tool constant coefficient, wherein the second calibration of the sensor tool comprises determining a refined azimuth angle from the sensor tool to the source based on the electromagnetic field measurements using the subrange of azimuth angles associated with the selected sensor tool coefficient.

2. The method of claim 1, wherein selecting the sensor tool constant coefficient comprises selecting the sensor tool constant coefficient associated with the subrange of azimuth angles that encompasses the azimuth angle from the sensor tool to the source.

3. The method of claim 1, further comprising performing a ranging operation from a target well using the calibrated sensor tool.

4. The method of claim 3, wherein performing the ranging operation comprises determining the azimuth angle and a distance to the source.

5. The method of claim 1, wherein performing the first calibration of the sensor tool comprises generating a plurality of measurements of a magnetic field at each sensor of the sensor tool, at different rotational positions of the sensor tool.

6. The method of claim 1, wherein measuring, with the sensor tool, the electromagnetic field comprises measuring a uniform field component and a gradient field component of the electromagneticfield.

7. The method of claim 6, wherein calibrating the sensor tool comprises calibrating a response of the sensor tool to the uniform field component and the gradient field component.

8. The method of claim 7, wherein calibrating the response of the sensor tool comprises adjusting uniform field and gradient field measurements by the sensor tool in response to the selected sensor tool constant coefficient.

9. The method of claim 1, wherein performing the first calibration of the sensor tool comprises calibrating the sensor tool using a 0°-360° azimuth angle relative direction.

10. An apparatus comprising:
a plurality of electromagnetic field sensors disposed around a periphery of the apparatus; and
circuitry coupled to the plurality of electromagnetic field sensors to,
measure, with the plurality of electromagnetic field sensors, an electromagnetic field generated by an excitation source using a first range of azimuth angles;
perform a first calibration of the apparatus to generate a plurality of sensor tool constant coefficients, each sensor tool constant coefficient associated with a different subrange within the first range of azimuth angles;

determine an azimuth angle from the apparatus to the excitation source from the electromagnetic field measurements and the plurality of sensor tool constant coefficients;

select a sensor tool constant coefficient from the plurality of sensor tool constant coefficients based on the determined azimuth angle from the apparatus to the excitation source; and perform a second calibration of the apparatus, wherein performing a second calibration calibrates uniform field and gradient field measurements provided by the electromagnetic field sensors based on the selected sensor tool constant coefficients, wherein the second calibration of the sensor tool comprises determining a refined azimuth angle from the sensor tool to the excitation source based on the electromagnetic field measurements using the subrange of azimuth angles associated with the selected sensor tool coefficient.

11. The apparatus of claim 10, wherein the plurality of electromagnetic field sensors comprise induction coil sensors.

12. The apparatus of claim 10, wherein the plurality of electromagnetic field sensors comprise fluxgate magnetometers.

13. The apparatus of claim 10, wherein the circuitry comprises memory to store a database of the plurality of sensor tool constant coefficients and their associated, respective range of azimuth angles.

14. The apparatus of claim 10, wherein the circuitry is to determine the selected one of the plurality of sensor tool constant coefficients in response to an azimuth angle between the apparatus and the excitation source.

15. A system comprising:

a target well comprising a casing;

an excitation source to produce an electromagnetic field;

a sensor tool in a ranging well, the sensor tool to measure a total electromagnetic field including a uniform field component and a gradient field component; and circuitry coupled to the sensor tool to,
measure, with the sensor tool, the electromagnetic field generated by the excitation source using a first range of azimuth angles;

perform a first calibration of the sensor tool to generate a plurality of sensor tool constant coefficients, each sensor tool constant coefficient associated with a different subrange within the first range of azimuth angles;

determine an azimuth angle from the sensor tool to the source from the electromagnetic field measurements and the plurality of sensor tool constant coefficients;

select a sensor tool constant coefficient from the plurality of sensor tool constant coefficients based on the determined azimuth angle from the sensor tool to the excitation source; and perform a second calibration of the sensor tool, wherein performing a second calibration calibrates the uniform field and gradient field measurements from the sensor tool based on the selected sensor tool constant coefficients, wherein the second calibration of the sensor tool comprises determining a refined azimuth angle from the sensor tool to the source based on the electromagnetic field measurements using the subrange of azimuth angles associated with the selected sensor tool coefficient.

16. The system of claim 15, wherein the system further comprises a drill string and the sensor tool is disposed in the drill string.

17. The system of claim 15, wherein the system further comprises a wireline tool and the sensor tool is disposed in the wireline tool.

18. The system of claim 15, wherein the sensor tool comprises a plurality of sensors, each sensor having a sensor coil coupled to an amplifier.

19. The system of claim 18, wherein each sensor is to generate a voltage that is proportional to an amplitude of the electromagnetic field projection on its respective axis.

20. The system of claim 15, wherein the circuitry is further configured to select the sensor tool constant coefficient based on an azimuth angle between the sensor tool and the target well.

* * * * *